(12) United States Patent
Gruendl et al.

(10) Patent No.: US 9,793,442 B2
(45) Date of Patent: Oct. 17, 2017

(54) OPTOELECTRONIC COMPONENT

(71) Applicant: OSRAM Opto Semiconductors GmbH, Regensburg (DE)

(72) Inventors: Andreas Gruendl, Laaber (DE); Tobias Gebuhr, Regensburg (DE); Markus Pindl, Tegernheim (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 15/034,017

(22) PCT Filed: Nov. 4, 2014

(86) PCT No.: PCT/EP2014/073731
§ 371 (c)(1),
(2) Date: May 3, 2016

(87) PCT Pub. No.: WO2015/067613
PCT Pub. Date: May 14, 2015

(65) Prior Publication Data
US 2016/0284943 A1 Sep. 29, 2016

(30) Foreign Application Priority Data

Nov. 8, 2013 (DE) .................. 10 2013 222 703

(51) Int. Cl.
*H01L 33/00* (2010.01)
*H01L 33/48* (2010.01)
*H01L 33/58* (2010.01)

(52) U.S. Cl.
CPC .......... *H01L 33/483* (2013.01); *H01L 33/486* (2013.01); *H01L 33/58* (2013.01)

(58) Field of Classification Search
CPC ...... H01L 33/783; H01L 33/486; H01L 33/58
USPC ........................................................ 257/98
See application file for complete search history.

(56) References Cited

U.S. PATENT DOCUMENTS

| | | |
|---|---|---|
| 2004/0041222 A1 | 3/2004 | Loh |
| 2006/0022215 A1 | 2/2006 | Arndt et al. |
| 2006/0108594 A1* | 5/2006 | Iwasaki ............... H01L 33/58 |
| | | 257/98 |
| 2008/0012033 A1 | 1/2008 | Arndt |
| 2008/0121921 A1 | 5/2008 | Loh et al. |
| 2010/0290233 A1 | 11/2010 | Okazaki |
| 2011/0062471 A1 | 3/2011 | Bierhuizen et al. |
| 2012/0153334 A1 | 6/2012 | Park et al. |

(Continued)

FOREIGN PATENT DOCUMENTS

| | | |
|---|---|---|
| DE | 10 2007 033 057 a1 | 1/2008 |
| DE | 10 2010 024 862 A1 | 12/2011 |

(Continued)

OTHER PUBLICATIONS

Notice of Reasons for Rejection dated May 9, 2017, of corresponding Japanese Application No. 2016-528074 in English.

*Primary Examiner* — David S Blum
(74) *Attorney, Agent, or Firm* — DLA Piper LLP (US)

(57) ABSTRACT

An optoelectronic component includes a housing having a top side, wherein an anchoring structure which is a positive relief is arranged at the top side, a covering element is arranged above the top side and anchored at the anchoring structure, and the covering element completely covers the top side.

14 Claims, 2 Drawing Sheets

(56) References Cited

U.S. PATENT DOCUMENTS

| | | | |
|---|---|---|---|
| 2012/0267671 A1 | 10/2012 | Jung et al. | |
| 2013/0070441 A1* | 3/2013 | Moon | H01L 33/483 |
| | | | 362/84 |
| 2015/0179903 A1* | 6/2015 | Pun | |

FOREIGN PATENT DOCUMENTS

| | | |
|---|---|---|
| EP | 1 467 416 A2 | 10/2004 |
| JP | 2006-516816 | 7/2006 |
| JP | 2008-501227 | 1/2008 |
| JP | 2010-343395 | 2/2010 |
| JP | 2011-119557 | 6/2011 |
| JP | 2012-227511 | 11/2012 |
| WO | 2008/052327 A1 | 5/2008 |

\* cited by examiner

OPTOELECTRONIC COMPONENT

TECHNICAL FIELD

This disclosure relates to an optoelectronic component.

BACKGROUND

Optoelectronic components comprising a housing and a covering structure arranged at the housing are known. The housing can be produced, for example, by a molding method and accommodates an optoelectronic semiconductor chip, for example, a light emitting diode chip. The covering structure can be arranged on the housing by a molding method or a metering method, for example, and covers the optoelectronic semiconductor chip. Depending on the materials used for the housing and the covering structure, only low adhesion between the housing and the covering structure arises, which can lead to undesired delamination of the covering structure from the housing.

SUMMARY

We provide an optoelectronic component including a housing having a top side, wherein an anchoring structure which is a positive relief is arranged at the top side, a covering element is arranged above the top side and anchored at the anchoring structure, and the covering element completely covers the top side.

We also provide an optoelectronic component including a housing having a top side, wherein an anchoring structure which is a positive relief is arranged at the top side, the anchoring structure includes at least two bar-shaped sections arranged at an angle with respect to one another, a covering element is arranged above the top side and anchored at the anchoring structure, and the covering element completely covers the top side.

Figure 1:
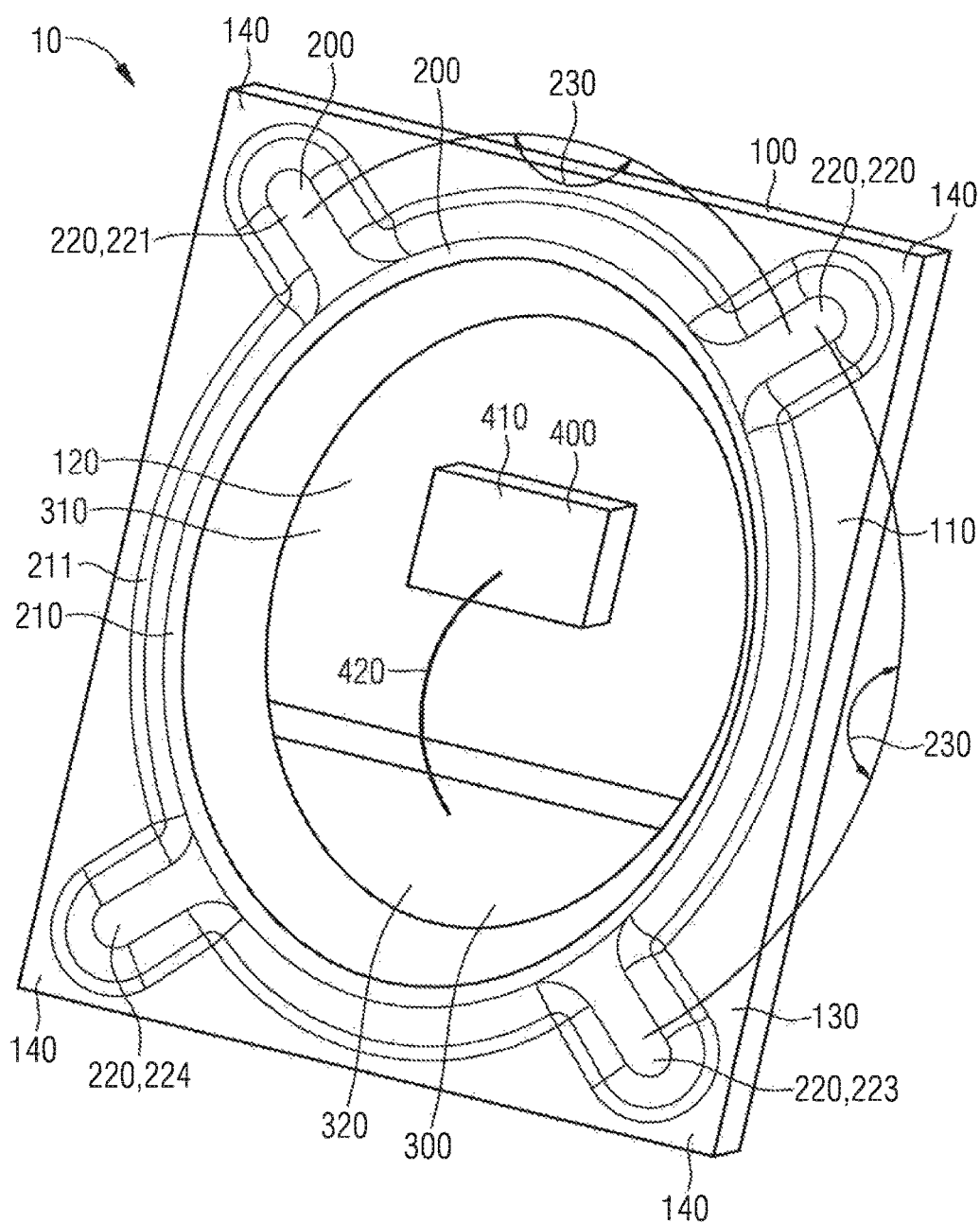
FIG. 1 shows a housing of an optoelectronic component.

LIST OF REFERENCE SIGNS 10 optoelectronic component
100 housing
110 top side
120 center region
130 outer region
140 corner
200 anchoring structure
210 ring-shaped section
211 outer circumference
220 bar-shaped section
221 first bar-shaped section
222 second bar-shaped section
223 third bar-shaped section
224 fourth bar-shaped section
230 angle
300 cavity
310 first leadframe section
320 second leadframe section
400 optoelectronic semiconductor chip
410 top side
420 bond wire
500 covering element
510 optical lens

DETAILED DESCRIPTION

Our optoelectronic component comprises a housing having a top side. An anchoring structure embodied as a positive relief is arranged at the top side. A covering element is arranged above the top side and anchored at the anchoring structure. The covering element completely covers the top side of the housing. A mechanically robust anchoring of the covering element at the housing is advantageously obtained by virtue of the anchoring structure embodied as a positive relief at the top side of the housing. As a result, there is only a small risk of undesired delamination of the covering element from the housing. The lifetime of the optoelectronic component can increase as a result. It is advantageously not necessary to select materials having a high mutual adhesion for the housing and the covering element. Even when materials having only low mutual adhesion are used, a sufficient anchoring of the covering element at the top side of the housing is achieved by virtue of the anchoring structure embodied as a positive relief at the top side of the housing. This allows for higher flexibility in the choice of the materials of the housing and the covering element of the optoelectronic component.

The anchoring structure may take up mechanical forces acting on the covering element in two mutually perpendicular directions parallel to the top side of the housing. Advantageously, the anchoring structure thereby prevents delamination of the covering element from the top side of the housing as a result of forces acting on the covering element parallel to the top side of the housing.

The anchoring structure may take up mechanical forces acting on the covering element in all directions parallel to the top side of the housing. Advantageously, the optoelectronic component is thereby robust in relation to mechanical forces acting on the covering element parallel to the top side of the housing.

The anchoring structure may comprise at least two bar-shaped sections arranged at an angle with respect to one another. Advantageously, the two bar-shaped sections of the anchoring structure, by virtue of their arrangement at an angle with respect to one another, can take up mechanical forces acting on the covering element in different spatial directions and thereby effectively prevent delamination of the covering element from the top side of the housing as a result of the mechanical forces acting on the covering element.

The two bar-shaped sections may be arranged perpendicular to one another. Advantageously, as a result, any mechanical force acting on the covering element from a direction parallel to the top side of the housing is taken up by at least one of the two bar-shaped sections of the anchoring structure of the optoelectronic component.

The anchoring structure may comprise at least three bar-shaped sections extending from a center region of the top side of the housing to an outer region of the top side of the housing. As a result, the anchoring structure advantageously achieves an anchoring of the covering element at the top side of the housing over a large area region of the top side of the housing, which anchoring is robust in relation to mechanical forces acting from different spatial directions.

The top side of the housing may have a quadrangular shape. In this case, the anchoring structure comprises four bar-shaped sections extending from the center region of the top side of the housing to the four corners of the top side of the housing. Advantageously, the anchoring structure thus achieves an anchoring of the covering element at the top side of the housing, which anchoring extends over the entire top side of the housing. In this case, in particular, the corners of the top side of the housing, which are particularly susceptible to delamination of the covering element from the top side of the housing, are protected against undesired delamination of the covering element from the top side of the housing by the four bar-shaped sections of the anchoring structure.

The anchoring structure may comprise a ring-shaped section. Advantageously, the ring-shaped section of the anchoring structure can also take up mechanical forces acting on the covering element or the housing from different spatial directions and can thereby prevent delamination of the covering element from the top side of the housing of the optoelectronic component.

The bar-shaped sections may adjoin an outer circumference of the ring-shaped section. The bar-shaped sections of the anchoring structure thus extend from the ring-shaped section of the anchoring structure radially outward. Experiments have shown that this brings about a particularly effective anchoring of the covering element at the top side of the housing of the optoelectronic component.

A cavity may be formed at the top side of the housing. The cavity can, for example, accommodate an optoelectronic semiconductor chip of the optoelectronic component. In this case, walls of the cavity at the top side of the housing can also serve as a reflector for electromagnetic radiation emitted by the optoelectronic semiconductor chip of the optoelectronic component. The cavity at the top side of the housing can also expose a contact pad of a leadframe embedded into the housing of the optoelectronic component.

The covering element may extend into the cavity. An optoelectronic semiconductor chip of the optoelectronic component arranged in the cavity can be embedded into the covering element in this case. Advantageously, the covering element thereby affords a mechanical protection of the optoelectronic semiconductor chip of the optoelectronic component.

An optoelectronic semiconductor chip may be arranged between the housing and the covering element. The optoelectronic semiconductor chip can be a light emitting diode chip, for example. The optoelectronic semiconductor chip emits electromagnetic radiation. By virtue of the arrangement of the optoelectronic semiconductor chip between the housing and the covering element, the optoelectronic semiconductor chip in the case of this optoelectronic component is advantageously protected against damage resulting from external mechanical influences.

The covering element may be an optical lens. By way of example, the covering element can be a converging lens. Advantageously, the covering element/optical lens thus brings about a beam shaping of an electromagnetic radiation emitted by an optoelectronic semiconductor chip of the optoelectronic component.

The covering element may comprise silicone. Advantageously, the covering element can thus be produced in a simple and cost-effective manner and has robust and durable mechanical properties.

The above-described properties, features and advantages and the way in which they are achieved will become clearer and more clearly understood in association with the following description of the examples explained in greater detail in association with the drawings.

FIG. 1 shows a schematic perspective view of a housing 100 of an optoelectronic component 10. The optoelectronic component 10 can be a light emitting diode component, for example. The optoelectronic component 10 can be, for example, an SMD component for surface mounting, for example, mounting by reflow soldering.

The housing 100 of the optoelectronic component 10 has a top side 110 visible in FIG. 1. The top side 110 of the housing 100 is rectangular in the illustrated example and has four corners 140. However, it is possible for the top side 110 of the housing 100 to be different from a rectangle.

A cavity 300 is formed in a center region 120 of the top side 110 of the housing 100. The cavity 300 extends from the top side 110 of the housing 100 into the body of the housing 100. At the top side 110 of the housing 100, the cavity 300 has an elliptical shape in the example illustrated in FIG. 1. However, the opening of the cavity 300 at the top side 110 of the housing 100, could also have a circular disk shape, a rectangular shape, or some other shape. In the direction from the top side 110 of the housing 100 into the body of the housing 100, the cavity 300 tapers conically in the example shown in FIG. 1. However, the cavity 300 could also be shaped cylindrically or differently.

The housing 100 of the optoelectronic component 10 comprises an embedded first leadframe section 310 and an embedded second leadframe section 320. The first leadframe section 310 and the second leadframe section 320 are each substantially flat and planar plate sections and are arranged in a common plane parallel to the top side 110 of the housing 100. The first leadframe section 310 and the second leadframe section 320 each comprise an electrically conductive material, for example, a metal. The first leadframe section 310 and the second leadframe section 320 are electrically insulated from one another. The first leadframe section 310 and the second leadframe section 320 may have been formed from a common leadframe during the production of the housing 100 of the optoelectronic component 10.

A part of a first surface of the first leadframe section 310 and a part of a first surface of the second leadframe section 320 are exposed at the base of the cavity 300 and are accessible there. Parts of a second surface of the first leadframe section 310, the second surface being situated opposite the first surface of the first leadframe section 310, and parts of a second surface of the second leadframe section 320, the second surface being situated opposite the first surface of the second leadframe section 320, can be exposed at a rear side of the housing 100, the rear side being situated opposite the top side 110 of the housing 100, and form electrical contact pads of the optoelectronic component 10 there.

The housing 100 of the optoelectronic component 10 can comprise, for example, an epoxy resin or some other plastics material suitable for a molding method. The material of the housing 100 is electrically insulating. The housing 100 can be produced by a molding method, for example, by injection molding. The first leadframe section 310 and the second leadframe section 320 are preferably already embedded into the material of the housing 100 during the production of the housing 100. The housing 100 can be produced in an assemblage with a multiplicity of housings of the same type and can subsequently be singulated by division of the assemblage.

An optoelectronic semiconductor chip 400 is arranged in the cavity 300 of the housing 100 of the optoelectronic component 10. The optoelectronic semiconductor chip 400 can be a light emitting diode chip (LED chip), for example. The optoelectronic semiconductor chip 400 has a top side 410 visible in FIG. 1, and an underside situated opposite the top side 410. The top side 410 of the optoelectronic semiconductor chip 400 can form a radiation emission face of the optoelectronic semiconductor chip 400. In this case, during operation of the optoelectronic semiconductor chip 400, electromagnetic radiation is emitted at the top side 410 of the optoelectronic semiconductor chip 400, the top side forming the radiation emission face. The optoelectronic semiconductor chip 400 comprises two electrical contact pads of which, for example, one can be arranged at the top side 410 and one can be arranged at the rear side of the optoelectronic semiconductor chip 400.

The optoelectronic semiconductor chip 400 is arranged in the cavity 300 on that section of the top side of the first leadframe section 310 accessible in the cavity 300. In this case, the rear side of the optoelectronic semiconductor chip 400 faces the first leadframe section 310 and connects to the first leadframe section 310 such that there is an electrically conductive connection between that electrical contact pad of the optoelectronic semiconductor chip 400 arranged at the rear side of the optoelectronic semiconductor chip 400 and the first leadframe section 310. The optoelectronic semiconductor chip 400 can be fixed to the first leadframe section 310 by a solder or by an electrically conductive adhesive, for example. That electrical contact pad of the optoelectronic semiconductor chip 400 arranged at the top side 410 of the optoelectronic semiconductor chip 400 electrically conductively connects, by a bond wire 420, to that section of the top side of the second leadframe section 320 accessible at the bottom of the cavity 300. If the housing 100 of the optoelectronic component 10 is produced in an assemblage with a plurality of housings of the same type, then the arrangement of the optoelectronic semiconductor chip 400 in the cavity 300 of the housing 100 can be carried out before the housing 100 is actually singulated by division of the assemblage.

Figure 2:
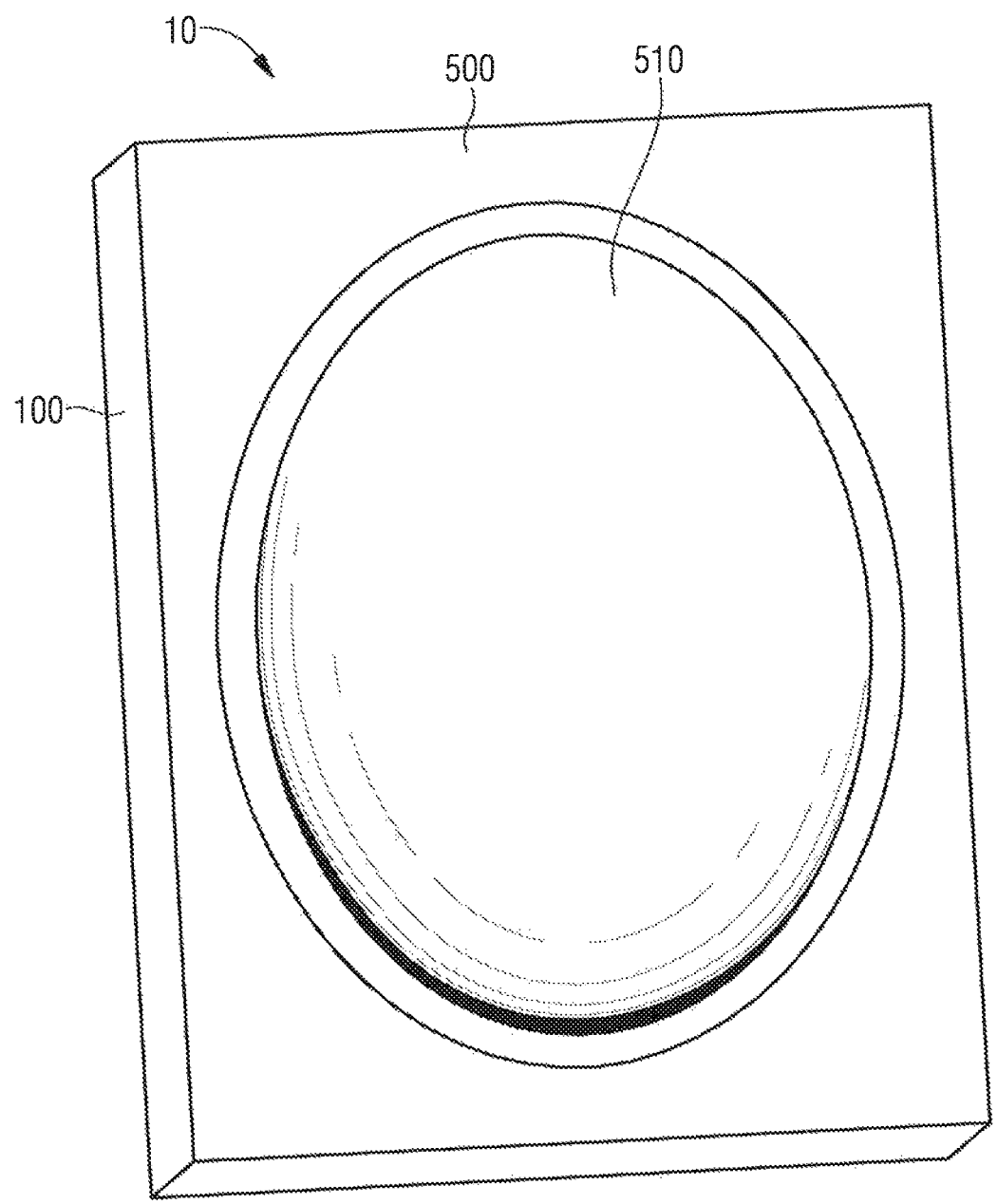
FIG. 2 shows the optoelectronic component with a covering element arranged on the housing.

FIG. 2 shows a schematic perspective view of the optoelectronic component 10 in a processing state temporally succeeding the illustration in FIG. 1. In a processing step carried out between the processing states illustrated in FIGS. 1 and 2, a covering element 500 was arranged above the top side 110 of the housing 100. The covering element 500 preferably completely covers the top side 110 of the housing 100. Preferably, the material of the covering element 500 additionally fills the cavity 300 of the housing 100 such that the optoelectronic semiconductor chip 400 arranged in the cavity 300 is embedded into the material of the covering element 500. However, it is also possible for the cavity 300, before the arrangement of the covering element 500, first to be wholly or partly filled with a potting material and the covering element 500 subsequently to be arranged on the potting material.

The covering element 500 protects the optoelectronic semiconductor chip 400 against damage resulting from external influences, for example, protection against mechanical influences and influences of dust and moisture.

In the example shown in FIG. 2, the covering element 500 additionally has an elevated section in a region arranged perpendicularly above the cavity 300 of the housing 100, the elevated section forming an optical lens 510. The optical lens 510 can be a converging lens, for example. That part of the covering element 500 forming the optical lens 510 can also be omitted, however.

The covering element 500 may have been formed, for example, by a molding method, for instance by compression molding, or by a metering method (dispensing) above the top side 110 of the housing 100. If the housing 100 is produced in an assemblage with a plurality of housings of the same type, then the arrangement of the covering element 500 above the top side 110 of the housing 100 can also be carried out before the housing is singulated by division of the assemblage.

The covering element 500 comprises a material substantially transparent to electromagnetic radiation emitted by the optoelectronic semiconductor chip 400 of the optoelectronic component 10. By way of example, the covering element 500 can comprise a silicone or an epoxy resin. The material of the covering element 500 can additionally comprise embedded particles. By way of example, the material of the covering element 500 can comprise embedded wavelength-converting particles that convert a wavelength of an electromagnetic radiation emitted by the optoelectronic semiconductor chip 400.

The materials of the housing 100 and the covering element 500 of the optoelectronic component 10 can be chosen such that there is only low mutual adhesion between the materials. Even in this case it is necessary to ensure a stable and permanent fixing of the covering element 500 to the top side 110 of the housing 100 and to rule out undesired delamination of the covering element 500.

For this purpose, an anchoring structure 200 visible in FIG. 1 is arranged at the top side 110 of the housing 100. The anchoring structure 200 is a positive relief rising above the otherwise planar sections of the top side 110 outside the cavity 300. The anchoring structure 200 improves adhesion of the covering element 500 to the top side 110 of the housing 100. The anchoring structure 200 can take up mechanical forces acting on the covering element 500 in at least two mutually perpendicular directions parallel to the top side 110 of the housing. Preferably, the anchoring structure 200 can take up mechanical forces acting on the covering element 500 in all directions parallel to the top side 110 of the housing 100. Particularly preferably, the anchoring structure 200 can also take up mechanical forces acting on the covering element 500 perpendicularly to the top side 110 of the housing 100.

The anchoring structure 200 comprises a ring-shaped section 210 in the example illustrated in FIG. 1, although the ring-shaped section can also be omitted. The ring-shaped section 210 bounds the opening of the cavity 300 at the top side 110 of the housing 100. In addition to anchoring the covering element 500 at the top side 110 of the housing 100, the ring-shaped section 210 of the anchoring structure 200 can also provide overflow protection for a potting material if the cavity 300 is first filled with the potting material before the arrangement of the covering element 500 at the top side 110 of the housing 100.

Alongside the ring-shaped section 210, the anchoring structure 200 at the top side 110 of the housing 100 comprises a plurality of bar-shaped sections 220. The bar-shaped sections 220 are substantially rectilinear elongate sections whose longitudinal extension direction is oriented parallel to the top side 110 of the housing 100. In this case, at least two of the bar-shaped sections 220 are arranged at an angle 230 with respect to one another. By way of example, as illustrated in FIG. 1, two bar-shaped sections 220 can be arranged at approximately a right angle 230 with respect to one another. As a result, the two bar-shaped sections 220 can take up mechanical forces acting on the covering element in two mutually perpendicular directions parallel to the top side 110 of the housing 100.

An effective anchoring of the covering element 500 at the top side 110 of the housing 100 by the anchoring structure 200 arises if the anchoring structure 200 comprises at least three bar-shaped sections 220 extending from the center region 120 of the top side 110 of the housing 100 to an outer region 130 of the top side 110 of the housing 100. By way of example, the bar-shaped sections 220 can run radially from the center region 120 to the outer region 130 of the top side 110 of the housing 100.

In the example illustrated in FIG. 1, the anchoring structure 200 comprises four bar-shaped sections 220, designated as first bar-shaped section 221, second bar-shaped section 222, third bar-shaped section 223 and fourth bar-shaped section 224. Each of the bar-shaped sections 221, 222, 223, 224 adjoins an outer circumference 211 of the ring-shaped section 210 of the anchoring structure 200 and extends, proceeding from the outer circumference 211 of the ring-shaped section 210, outward into the outer region 130 of the top side 110 of the housing 100. In this case, each of the bar-shaped sections 221, 222, 223, 224 extends to one of the corners 140 of the top side 110 of the housing 100. The angles 230 between two bar-shaped sections 221, 222, 223, 224 of the anchoring structure 200 that are adjacent in the circumferential direction of the ring-shaped section 210 are approximately 90° as a result.

The material of the covering element 500 may be subjected to material shrinkage during curing after arrangement at the top side 110 of the housing 100. By virtue of this material shrinkage, the covering element 500 is particularly effectively fixed to the anchoring structure 200 at the top side 110 of the housing 100. The anchoring of the covering element 500 at the anchoring structure 200 at the top side 110 of the housing 100 that is brought about by the shrinkage of the material of the covering element 500 also anchors the covering element 500 in a direction perpendicular to the top side 110 of the housing 100.

Our components have been illustrated and described in greater detail on the basis of the preferred examples. Nevertheless, this disclosure is not restricted to the examples disclosed. Rather, other variations can be derived therefrom by those skilled in the art, without departing from the scope of protection of this disclosure.

This application claims priority of DE 10 2013 222 703.5, the subject matter of which is incorporated herein by reference.

The invention claimed is:

1. An optoelectronic component comprising a housing having a top side,
   wherein an anchoring structure which is a positive relief is arranged at the top side,
   the anchoring structure comprises at least two bar-shaped sections arranged at an angle with respect to one another,
   a covering element is arranged above the top side and anchored at the anchoring structure, and
   the covering element completely covers the top side and the anchoring structure.

2. The optoelectronic component as claimed in claim 1, wherein the anchoring structure can absorb mechanical forces acting on the covering element in two mutually perpendicular directions parallel to the top side of the housing.

3. The optoelectronic component as claimed in claim 2, wherein the anchoring structure can absorb mechanical forces acting on the covering element in all directions parallel to the top side of the housing.

4. The optoelectronic component as claimed in claim 1, wherein the two bar-shaped sections are arranged perpendicular to one another.

5. The optoelectronic component as claimed in claim 1, wherein the anchoring structure comprises at least three bar-shaped sections extending from a center region of the top side of the housing to an outer region of the top side of the housing.

6. The optoelectronic component as claimed in claim 5, wherein the top side of the housing has a quadrangular shape, and
   the anchoring structure comprises four bar-shaped sections extending from the center region of the top side of the housing to the four corners of the top side of the housing.

7. The optoelectronic component as claimed in claim 1, wherein the anchoring structure comprises a ring-shaped section.

8. The optoelectronic component as claimed in claim 1, wherein the bar-shaped sections adjoin an outer circumference of the ring-shaped section.

9. The optoelectronic component as claimed in claim 1, wherein a cavity is formed at the top side of the housing.

10. The optoelectronic component as claimed in claim 9, wherein the covering element extends into the cavity.

11. The optoelectronic component as claimed in claim 1, wherein an optoelectronic semiconductor chip is arranged between the housing and the covering element.

12. The optoelectronic component as claimed in claim 1, wherein the covering element is an optical lens.

13. The optoelectronic component as claimed in claim 1, wherein the covering element comprises silicone.

14. The optoelectronic component as claimed in claim 7, wherein the bar-shaped sections adjoin an outer circumference of the ring-shaped section.

* * * * *